United States Patent [19]

Ohishi et al.

[11] 4,193,768

[45] Mar. 18, 1980

[54] METHOD FOR PREPARING CORUNDUM PARTICLES

[75] Inventors: Naoaki Ohishi, Machida; Toshiaki Sakaida; Mitsuru Hasegawa, both of Yokohama, all of Japan

[73] Assignee: Showa Denko K. K., Tokyo, Japan

[21] Appl. No.: 862,138

[22] Filed: Dec. 19, 1977

Related U.S. Application Data

[63] Continuation of Ser. No. 703,228, Jul. 7, 1976, abandoned.

[30] Foreign Application Priority Data

Jul. 28, 1975 [JP] Japan .................................. 50-91042

[51] Int. Cl.² ........................ B01D 9/02; B01J 17/04; C01F 7/02
[52] U.S. Cl. .................................. 23/301; 23/305 A; 156/623 R; 156/DIG. 61; 423/625
[58] Field of Search ............ 23/305 A, 301; 423/625; 156/61, 621, 622, 623 R, DIG. 61

[56] References Cited

U.S. PATENT DOCUMENTS 3,101,259  8/1963  Sawyer .......................... 156/623 R

FOREIGN PATENT DOCUMENTS 83119    12/1970  German Democratic Rep. ..... 423/625
37-7750   3/1962  Japan ............................... 156/DIG. 61
39-13465  1/1964  Japan .................................. 156/623 R

OTHER PUBLICATIONS

Yamaguchi, Bul. Chem. Soc. of Japan, vol. 38, No. 1, pp. 54-58, 1-1 1965.
Lavdise et al., Solid State Physics; vol. 12, pp. 204-207 & 220-222, 1960.
Chem. Ab., Tertian et al., vol. 52; col. 19396 b-1, No. 22, 11-25-58.
Sato, J. Appl. Chem., vol. 9, pp. 331-340, 6-1959.

*Primary Examiner*—Joseph Scovronek
*Assistant Examiner*—Bradley Garris
*Attorney, Agent, or Firm*—Fitzpatrick, Cella, Harper & Scinto

[57] ABSTRACT

A method for preparing corundum particles by a hydrothermal process which comprises adding fine particles of corundum to a starting alumina hydrate, and subjecting the resulting mixture to a hydrothermal reaction or treatment, the alumina in the alumina hydrate being deposited on the surfaces of the fine corundum particles while suppressing formation of new corundum crystal nuclei.

7 Claims, 2 Drawing Figures

METHOD FOR PREPARING CORUNDUM PARTICLES

This is a continuation of application Ser. No. 703,228, filed July 7, 1976 and now abandoned.

BACKGROUND OF THE INVENTION

1. Field of the Invention

This invention relates to a method for preparing corundum particles by a hydrothermal process, and more particularly to a method of efficiently preparing corundum particles in almost spherical and polyhedric forms which are excellent in crystallinity and high in purity.

2. Description of the Prior Art

Corundum particles which are known to be industrially useful as an abrasive material, electric insulator, material for fusion spraying, sintered material, various kinds of fillers and the like have been heretofore produced by finely powdering fused corundum blocks obtained from Bayer alumina or bauxite as a starting material. However, this production process is disadvantageous in that the corundum particles obtained by the process are relatively poor in crystallinity and purity and are irregular in shape. In order to overcome the above disadvantage, there have been proposed several processes of preparing single crystal particles of corundum, for example, in Japanese Patent Publication Nos. 7750/1962 and 13465/1964, in which processes alumina or alumina hydrate with low crystallinity is subjected to a hydrothermal treatment to obtain particles of hexagonal platy or columnar corundum single crystals. However, these processes also have the disadvantage that the size of the corundum particles cannot be suitably controlled even by properly selecting the treating conditions falling within the range described in the above patent specifications, such as particle size of the starting material, pressure, temperature, etc. Thus, these processes are not necessarily suitable for producing corundum particles with a desired size in an efficient manner. Further, as will be understood from the Examples of the foregoing patent specification, the production of corundum particles by the hydrothermal treatment of an alumina hydrate at 450° C. or less undesirably requires a high pressure of generally above 500 kg/cm$^2$, preferably above 1000 kg/cm$^2$. This in turn requires costly equipment so as to realize the industrial production of corundum particles under such severe pressure conditions. In addition, the corundum particles obtained by these processes are substantially composed of hexagonal platy or columnar crystals and contain almost no spherically polyhedric particles.

SUMMARY OF THE INVENTION

It is therefore an object of the present invention to provide a method for preparing by hydrothermal reaction almost spherically polyhedric particles of corundum which are excellent in crystallinity and purity.

It is another object of the present invention to provide a method for preparing corundum particles with a desired size under relatively low pressure in an efficient manner.

It is a further object of the present invention to provide a method for preparing corundum particles in which the particle size can be arbitrarily controlled with ease, since the changing of the hydrothermal temperature and pressure conditions and the particle size of the starting alumina hydrate according to a desired size of corundum particles are not required.

The above objects can be achieved by a method of the present invention which comprises mixing fine particles of corundum (i.e., seed crystals of corundum) with an alumina hydrate and subjecting the mixture to a hydrothermal treatment or reaction to deposit corundum onto the fine seed crystals or particles of corundum until the fine particles of corundum are grown to a desired size while suppressing formation of new crystal nuclei of corundum.

DESCRIPTION OF THE PREFERRED EMBODIMENTS

Figure 1:
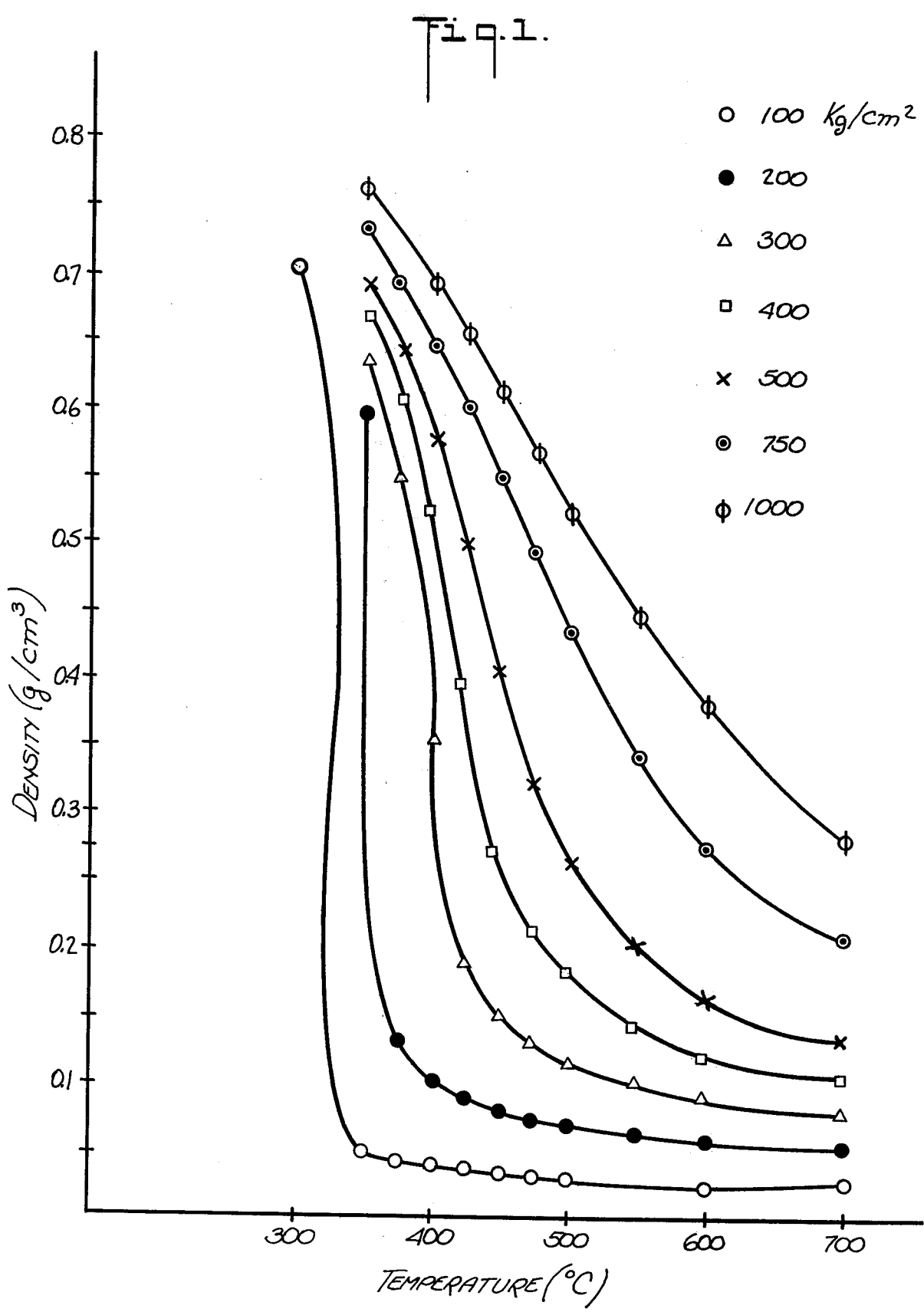
FIG. 1 illustrates the relationship of water density to temperature at different pressures.

The method of the present invention has a number of advantages. First, the size of the particles of corundum can be arbitrarily controlled by changing only the size distribution of the corundum seed crystals and the ratio of the seed crystals to alumina hydrate starting material, with a remarkably high control accuracy. Another advantage of the present invention is that seed crystals of corundum particles which are present in the hydrothermal reaction system are allowed to grow while suppressing formation of new crystal nuclei of corundum which requires a greater activation energy, so that the growth of the seed corundum particles to a desired size is feasible at temperatures lower than in the case of known hydrothermal processes using no seed crystals. In addition, almost spherical polyhedric corundum particles are obtainable under pressures lower than those used in conventional hydrothermal processes.

The corundum particle product obtained according to the method of the invention is almost free from cracks or strains, is excellent in crystallinity and purity and is in the form of an almost spherical polyhedron. Accordingly, this product can be packed in a high packing density upon molding, resulting in bonded abrasives or sintered materials with excellent quality. When these corundum particles are used for lapping abrasion, no scratches are produced on the material being lapped. Furthermore, this is a pertinent product as an electric insulator due to the high purity thereof.

The following is a helpful discussion with regard to one specific aspect of the invention in which seed crystals of corundum, whose addition is essential in the present invention, play a role completely different from that discussed in Bull. Chem. Soc. Japan Vol. 36, No. 9, pp. 1155–1158 (1963) and Vol. 38, No. 1, pp. 54–58 (1965). In the literature, when an alumina hydrate is hydrothermally treated by adding thereto seed crystal particles of corundum, formation of new crystal nuclei of corundum is generally induced by the catalytic action of the seed crystals. A major proportion of the corundum particles obtained are those obtained as a result of the growth of the newly-produced crystal nuclei of corundum. Thus, the final corundum particle product is substantially the same as that obtained by the processes using no seed crystals as described in the Japanese Patent Publication Nos. 7750/1962 and 13465/1964. In this case, the particle size of the final corundum particles is dependent on the amount of generation of newly-produced corundum crystal nuclei and is therefore greatly influenced by the size of starting alumina hydrate particles, hydrothermal reaction temperature and pressure, etc. In contrast, the present invention contemplates to grow the seed crystals per se while suppressing the formation of new crystal nuclei of corundum, thereby producing corundum particles with a desired, uniform particle size. Accordingly, the average particle size of the corundum particles obtained by the method of the invention is always greater than the average particle size of the seed crystal particles. In this connection, however, the average particle size of the corundum particles derived from the newly produced corundum crystal nuclei is, in most cases, rather smaller than that of the seed crystal particles per se. This will be clear from the following Table 1 excerpted from the aforementioned 1963 report.

Table 1

| particle size of added corundum ($\mu$) | particle size of produced corundum ($\mu$) |
| --- | --- |
| 2.1 | 2.8 ± 1.1 |
| 2.1 | 1.8 ± 1.1 |
| 47.0 | 29.2 ± 7.5 |
| 500 | 34.2 ± 10.4 |

From the above table, it will be understood that the mechanism of formation of corundum particles in the present invention is completely different from the known one.

Another aspect of the present invention is that a corundum particle product with desired crystallographic properties and a desired size distribution range can be substantially arbitrarily obtained by properly selecting the kind, size, etc., of seed crystals. That is, the range of size distribution of the corundum particle product is arbitrarily controllable merely by changing the range of the size distribution of the seed crystals per se. The use of seed crystal particles with either a single crystal or a polycrystalline form results in a corundum particle product of a corresponding crystalline form. Especially when it is desired to obtain single crystal particles of corundum having a small range of size distribution and an almost spherical polyhedric form, it will suffice to treat, according to the method of the invention, seed crystals which are obtained by finely powdering fused corundum or Bayer alumina to obtain single crystal particles and subjecting the single crystal particles to classification by a suitable means.

Fine seed crystals or particles of corundum useful in the present invention are, for example, those of Bayer alumina, fused alumina and the like. Though not critical, the particle size is preferred to be below 100$\mu$ from an economical point of view since the greater the particle size, the longer period of time required before the crystal particles attain the same level of a growing ratio.

A further aspect of the present invention resides in that single crystal particles of corundum in an almost spherical polyhedric form which have improved mechanical strength and excellent purity can be obtained even when there is used as starting seed crystals, single crystal particles which are crystallographically incomplete due to the presence of cracks or dislocations and are poor in purity. This is because it is possible in the present invention to cover each of the seed crystal particles with a corundum layer with excellent crystallinity and purity in thicknesses two or more times as great as the radius of the seed crystal particles. Thus, the seed crystals of inferior purity are each captured in the center of a final corundum particle. The covered corundum particle product may be used, depending on the purpose in end use, similarly to an ordinary hydrothermal reaction product with a substantial corundum purity of 100%.

The particular procedure for carrying out the method of the invention will be described in detail below.

In the practice of the invention, it is essentially required that seed crystals of corundum be added to the reaction system and be hydrothermally treated under specific conditions to grow the seed crystals while suppressing formation of new crystal nuclei of corundum which otherwise tend to be produced.

In order to meet the above requirements, the concentration of aluminate ions produced by dissolving the starting alumina hydrate in a solvent (i.e., water) must be maintained within a certain range in the entirety of the reaction system being treated under hydrothermal conditions, and mechanical shocks which tend to induce formation of new crystal nuclei of corundum must also be avoided. In other words, the following requirements must be satisfied:

(1) The seed crystals have surface areas sufficient to ensure the deposition of aluminate ions on the surfaces of the seed crystal particles of corundum to form growing corundum before the concentration of the aluminate ions which are derived from the alumina hydrate dissolved in the solvent in the hydrothermal step reaches a value sufficient to produce new corundum crystal nuclei.

(2) The starting alumina hydrate and the seed crystal particles of corundum must be uniformly mixed with each other prior to the hydrothermal reaction since when the seed crystals gather locally in the reaction system under hydrothermal conditions, there is a possibility that corundum crystal nuclei may be newly produced from the aluminate ions in seed crystal-free regions.

(3) The convection current of the solvent must be suppressed to a minimum so as to prevent the seed crystals and the starting alumina hydrate from being separated from each other in particle size, the separation and segregation being caused by a kind of sedimentation action resulting from the disturbance of the uniform starting mixture and solvent in the hydrothermal step, and also to prevent the reaction system from suffering from mechanical shocks due to the disturbance of the starting mixture per se.

The above requirement (1) can be satisfied by suitably selecting a ratio of a total surface area of seed crystals to a total weight of a starting alumina hydrate calculated as alumina trihydrate. That is, when the total weight of starting alumina hydrate calculated as alumina trihydrate is taken as $W_R$ (g) and the total surface area of the corundum seed crystals as $A_S$(cm$^2$), the ratio, $W_R/A_S$, is preferably below 0.05 g/cm$^2$, and most preferably below 0.02 g/cm$^2$, so as to obtain a corundum particle product with an accurately controlled particle size. The $W_R/A_S$ ratio can be determined by the following method. First, the number of corundum particles to be seed crystals is determined by grouping the particles, according to the diameters thereof at intervals of 1$\mu$, by a microscope method as prescribed in JIS (Japanese Industrial Standard) R6002. When the number of particles of the nth group (with a particle size range width of 1$\mu$) from the smallest (or the largest) is taken as $f_n$, the diameter of the particles of the nth group as $D_n$ (cm), the weight and surface area of the measured sample corundum particles as W (g) and A (cm²), respectively, the total weight of starting alumina hydrate actually employed in the hydrothermal treatment and calculated as trihydrate as $W_R$ (g), the total weight and total surface area of the corundum seed particles to be added for hydrothermal treatment as $W_s$ (g) and $A_s$ (cm²), respectively, and the true specific gravity of corundum as $\rho$ (=3.98 g/cm³), $$W = \frac{\pi \rho}{6} \sum_n f_n D_n^3 A = \pi \sum_n f_n D_n^2 \quad (1)$$

$$\frac{A_S}{A} = \frac{W_S}{W} \quad (2)$$

It then follows from the equations (1) and (2) that $$\frac{W_R}{A_S} = \frac{W_R}{W_S} \frac{\rho}{6} \frac{\sum_n f_n D_n^3}{\sum_n f_n D_n^2} \quad (3)$$

When experiments were conducted by changing the $W_A/A_S$ ratio of equation (3) over a wide range, it was found that a $W_R/A_S$ ratio exceeding 0.05 g/cm² resulted in an increase in the amount of formation of corundum crystal nuclei and the seed crystals were prevented from growing, with an extended distribution of corundum particle size. Further, it was found that with $W_R/A_S$ ratios of 0.05–0.02 g/cm² and below 0.02 g/cm², the formation of corundum particles derived from new corundum crystal nuclei could be suppressed below 20% and below 5% respectively.

As for the above requirement (2) concerning the uniform mixing of a starting alumina hydrate and seed crystals, it will suffice to powder or crush the alumina hydrate and seed crystals to an agglomerated particle-free or flocculated particle-free state and to sufficiently mix the powdered materials by a suitable means such as a V-blender. Alternatively, the starting alumina hydrate and seed crystals may be mixed with each other by means of a high speed agitating mixer while powdering large-sized agglomerated particles or flocculated particles. It should be noted that the use of an alumina hydrate with a large average particle size such as for example, more than 100 times that of the seed crystal particles, is not favorable since the seed crystals naturally gather locally when mixed with such large size alumina hydrate particles by a mere mechanical operation. Further, if the particle size of the alumina hydrate is too large, the solution velocity becomes unfavorably low, and is therefore preferably below 100μ.

The occurrence of the convection current during the course of the hydrothermal treatment, as described in the afore-mentioned requirement (3), is mainly due to the temperature difference in a vertical direction in the hydrothermal reaction container, particularly due to a material drop in temperature of an upper flange portion with an ordinary autoclave. Accordingly, the temperature gradient from the top toward the bottom of the container must be reduced to a minimum.

With reference to FIG. 1, there are shown curves of density versus temperature of water for different pressures, the curves being cited from *Heat Transfer Engineering Handbook*, Second Revised Edition (1966) published by The Japan Society of Mechanical Engineers. As will be understood from FIG. 1, the density of water is changed remarkably with temperatures which fall within ordinary hydrothermal treatment temperature and pressure ranges (i.e., 400°–500° C. and 300–1000 kg/cm², respectively). Thus it will be also understood that the temperature difference in the vertical direction readily causes the convection current of solvent (water) in the reaction system. The disturbance of the starting mixture by such a convection current may be prevented to a certain extent by packing or filling the starting mixture in a semi-closed internal case as closely as possible, and placing the case in the isothermal zone of the hydrothermal treatment container. The semi-closed internal case may comprise a cylindrical container having one open end and composed of, for example, stainless steel, having its open end covered with a cover or lid provided with a concentric opening therein. The hydrothermal treatment container may comprise any of the conventional autoclaves previously used for similar purposes.

The influence of the temperature gradient and the packed case on the hydrothermal treatment was experimentally confirmed. For example, when the hydrothermal treatment was conducted under such conditions that the upper portion of the internal case was held open and a temperature of the upper portion of an autoclave for hydrothermal treatment was lower by about 50° C. than that of a starting mixture-packed portion, a considerable amount of new corundum crystal nuclei were produced, it being hard to suitably control the size of the resulting corundum particles.

The packing density $\alpha$ (g/cm³) of the starting alumina hydrate per unit volume of the internal case to be packed with the starting mixture is preferably above 1.0 g/cm³ when calculated as trihydrate. In this connection, however, if the internal case is held semi-closed and the temperature difference in the vertical direction is maintained within 10° C., the packing density may be reduced down to 0.65 g/cm³ when calculated as trihydrate or 0.50 g/cm³ calculated as monohydrate so as to attain the purpose of the invention. The upper limit of the packing density is generally up to about 1.6 g/cm³.

When, however, the hydrothermal treatment was effected using a packing density below 0.52 g/cm³ calculated as trihydrate or below 0.4 g/cm³ calculated as monohydrate and without the use of such a semi-closed internal case as indicated above, the particle size distribution was greatly influenced by the temperature distribution in the hydrothermal treatment container.

As a matter of course, the hydrothermal reaction temperature and pressure suitable for the practice of the invention must be within ranges ensuring stability of corundum, which is understandable from a known Al₂O₃-H₂O phase diagram. As for pressure, however, a high pressure exceeding 500 kg/cm² as indicated in the aforementioned patents and reports is not needed. In general, the pressure useful in the present invention is in the range of 150 kg/cm² to 500 kg/cm², and the temperature in the range of 370° C. to 450° C. For example, there can be obtained polyhedric corundum particles with a growth ratio of 2–4 times in diameter compared to the original particle by hydrothermally treating the starting mixture at a temperature of 400° to 450° C. under a pressure of about 300 kg/cm² for 2 to 3 hours. The hydrothermal reaction time varies considerably depending on the temperature and pressure conditions and the diameter growth ratio of the particles and is generally selected in the range of 10 minutes to 10 hours.

The starting alumina hydrate useful in the invention may be either monohydrate or trihydrate since even when trihydrate is used initially, the trihydrate is always converted to monohydrate during the heating step for hydrothermal reaction and the converted monohydrate is actually used as a starting material for the formation of corundum. Further, an alumina hydrate which contains 1 mole or less of $H_2O$ per mole of $Al_2O_3$ may also be used in the practice of the invention so far as the alumina hydrate has a solution velocity higher than corundum added as seed crystals, under the same conditions.

The present invention will be particularly illustrated by way of the following examples, which should not be construed as limiting thereto the present invention.

EXAMPLE 1

To 6 g of alumina trihydrate ($Al_2O_3 \cdot 3H_2O$) obtained by the Bayer process and having a mean diameter (A median diameter determined on a weight basis. After-mentioned mean diameters have same meaning.) of 13.0μ was added finely-powdered fused corundum having a mean diameter of 10.2μ in such a manner that the $W_R/A_S$ ratio reached 0.005 g/cm$^2$ (corresponding to 9.8 wt% corundum in the mixture), followed by mixing in a mortar while deflocculating large-sized agglomerated particles with a pestle to obtain starting material $A_0$. The starting deflocculated material $A_0$ was filled together with 3 ml of water up to the brim of a stainless steel cylindrical internal case having an inner volume of 6.5 cm$^3$. The case was semi-closed with a stainless steel cover having a through-hole with a diameter of 2 mm at the center thereof. Then, the internal case was placed together with a small amount of water in an isothermal zone of the lower portion of a cone seal-type autoclave with an inner volume of 27 ml. After sealing the autoclave, the temperature in the internal case was raised at an average rate of 3.75° C./min and a hydrothermal reaction or treatment was effected under conditions of 450° C. and 500 kg/cm$^2$ for 5 hours to obtain product $A_1$.

Figure 2:
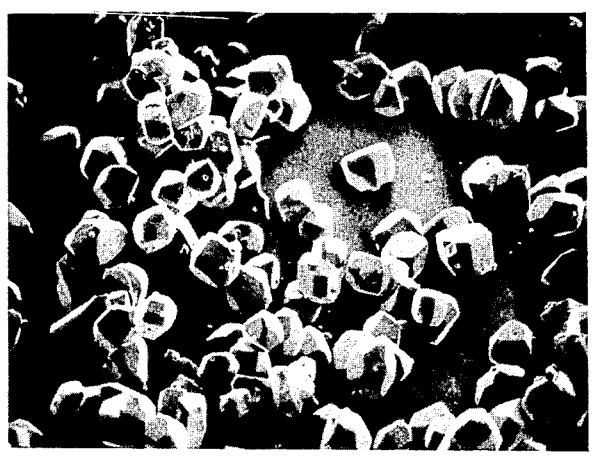
FIG. 2 is a microphotograph of the corundum particles produced by the method of the present invention.

Then, the above hydrothermal treatment procedure was repeated using starting material $B_0$ composed of 6 g of alumina trihydrate alone instead of the starting material $A_0$, thereby obtaining product $B_1$. The product $B_1$ obtained from the starting material $B_0$ without adding thereto seed crystals was found to include some relatively large particles of about 50μ in diameter in fine particles of about 1μ in diameter. Further, the identification and quantitative determination by an X-ray analysis and an ignition method revealed that the beohmite (alumina monohydrate) content was 60.1%. On the contrary, the product $A_1$ obtained from the starting material $A_0$ in accordance with the method of the invention was composed of 100% corundum in the form of almost spherical polyhedric particles as is clearly understood from a scanning electron microscope photograph thereof, shown in FIG. 2, and had a mean diameter of 27.9μ.

EXAMPLE 2

To 100 g of alumina trihydrate obtained by the Bayer process and having a mean diameter of 18.5μ was added finely-powdered fused corundum obtained by a classification and having a mean diameter of 16.3μ so as to provide a $W_R/A_S$ ratio of 0.015 g/cm$^2$ (corresponding to 5.9 wt% corundum in the mixture), followed by mixing in the same manner as in Example 1 to obtain starting material $C_0$. The starting material $C_0$ was filled together with a small amount of water in a stainless steel internal case with an inner diameter of 20 mm and an inner volume of 150 cm$^3$. Then, the internal case was covered with a stainless steel lid having a through-hole with a diameter of 2 mm, after which the internal case was placed together with a small amount of water in an isothermal zone of a modified Bridgeman type autoclave with an inner volume of 250 cm$^3$. After sealing the autoclave, the temperature in the case was raised at an average rate of 2° C./min and the hydrothermal reaction was conducted at 450° C. and 300 kg/cm$^2$ for 5 hours to obtain product $C_1$.

Then, 100 g of the same kind of alumina trihydrate as used in the starting material $C_0$ and 5.9 g of fine powder of fused corundum were weighed, respectively, and were each divided into halves, followed by powdering in a mortar. Thereafter, the divided powders of the alumina trihydrate and of corundum were alternately filled in the same internal case as used above in the order of fine powder of fused corundum and alumina trihydrate. The above procedure was repeated for effecting the hydrothermal treatment to obtain product $D_1$.

As a result, although both products $C_1$ and $D_1$ were each composed of 100% corundum, the product $D_1$ which was obtained without uniformly mixing the starting material (alumina trihydrate) with the seed crystals (fine powder of fused corundum), i.e., without suppressing formation of new corundum crystal nuclei, had a mean diameter of 12.7 μ and included fine particles of thin platy form and relatively large-sized particles of a polyhedric form. That is, the product $D_1$ had a wide distribution of size with two peaks as shown in Table 2. While, the product $C_1$ obtained according to the method of the invention had a mean diameter of 42μ, a polyhedric form similar to those of FIG. 2, and a sharp distribution of size as shown in Table 2 below.

Table 2

| product | >55μ | 55–45μ | 45–32μ | 32–20μ | 20–10μ | 10–8μ | <8μ | total |
|---|---|---|---|---|---|---|---|---|
| $C_1$ | 0 | 29.0 | 53.8 | 10.9 | 5.3 | 1.0 | 0 | 100 |
| $D_1$ | 0 | 0.9 | 4.0 | 33.7 | 18.3 | 40.1 | 3.0 | 100 |

EXAMPLE 3

Four samples of 100 g each of alumina trihydrate obtained by the Bayer process and having a mean diameter of 12.6μ were weighed. To these four alumina trihydrate samples were added predetermined amounts of finely-powdered fused corundum classified in a particle size range of 8 to 18μ and having a mean diameter of 10.5μ so as to provide $W_R/A_S$ ratios of 0.6 g/cm$^2$, 0.07 g/cm$^2$, 0.03 g/cm$^2$ and 0.01 g/cm$^2$, respectively, followed by uniformly mixing in the same manner as in Example 1 to obtain the starting mixtures $E_0$, $F_0$, $G_0$ and $H_0$. These mixtures were subjected to a hydrothermal treatment under the same conditions as in Example 2 to obtain products (each composed of 100% corundum) $E_1$, $F_1$, $G_1$ and $H_1$. The distribution of size and mean diameter of the products were determined on a weight basis. The results are shown in Table 3 below.

Table 3

| starting mixture | $W_R/A_S$ ratio (g/cm²) | product | distribution of size (wt. %) | | | | | | mean diameter (μ) |
|---|---|---|---|---|---|---|---|---|---|
| | | | >50 μ | 50–32 μ | 32–20 μ | 20–16 μ | 16–10 μ | <10 μ | |
| $E_O$ | 0.6 | $E_1$ | 0 | 0.1 | 7.2 | 12.4 | 25.3 | 45.0 | 11.0 |
| $F_O$ | 0.07 | $F_1$ | 0 | 1.0 | 25.2 | 10.3 | 28.0 | 35.5 | 12.5 |
| $G_O$ | 0.03 | $G_1$ | 0 | 6.8 | 58.5 | 6.7 | 12.3 | 15.7 | 24.5 |
| $H_O$ | 0.01 | $H_1$ | 0 | 17.0 | 70.5 | 8.8 | 1.0 | 2.6 | 26.5 |

As will be clear from the above Table, the products $E_1$ and $F_1$ which are obtained from the starting mixtures with $W_R/A_S$ ratios greater than 0.05 g/cm² contain about 35% of fine particles of a size below 10μ which is smaller than the mean diameter of the seed crystal corundum. This is due to formation of new corundum crystal nuclei. In addition, the products $E_1$ and $F_1$ do not have a sharp distribution of size. In contrast, the products $G_1$ and $H_1$ which are derived from the starting mixtures with $W_R/A_S$ ratios of 0.03 g/cm² and 0.01 g/cm² are each small in content of fine particles of a size below 10μ, with a sharp distribution of size.

Moreover, it will be understood that the product $E_1$ and $F_1$ obtained without suppressing formation of new corundum crystal nuclei have almost the same mean diameter as the seed crystal corundum particles (having a size of 10.5μ), whereas the products $G_1$ and $H_1$ which are obtained by growing the seed crystals while suppressing formation of new corundum crystal nuclei each have a mean diameter two or more times that of the seed crystal corundum.

EXAMPLE 4

105.9 g of the same kind of starting mixture $C_0$ (including the seed crystals) as used in Example 2 was divided into halves, one of which was filled in the same internal case as used in Example 2 (in which the packing ratio of the starting alumina trihydrate to the volume of the internal case was 0.256 g/cm³ when calculated as boehmite to be the monohydrate). Then, the internal case without being covered was placed in an autoclave with an inner volume of 250 cm³, followed by a hydrothermal treatment in the same manner as in Example 2 to obtain product $C_2$ composed of 100% corundum. The distribution of size and mean diameter of the product $C_2$ were determined, with the results shown in Table 4 together with those of the product $C_1$ which had been obtained in Example 2 by filling 105.9 g of the starting mixture $C_0$ in the internal case (in which case the packing ratio of the starting alumina trihydrate to the inner volume of the internal case was 0.513 g/cm³ when the alumina trihydrate was calculated as the monohydrate).

Table 4

| product | distribution of size (wt. %) | | | | | | | mean diameter (μ) |
|---|---|---|---|---|---|---|---|---|
| | >55μ | 55–45μ | 45–32μ | 32–20μ | 20–10μ | 10–8μ | <8μ | |
| $C_1$ | 0 | 29.0 | 53.8 | 10.9 | 5.3 | 1.0 | 0 | 41.5 |
| $C_2$ | 0 | 0.8 | 25.9 | 40.2 | 18.6 | 4.3 | 10.2 | 25.3 |

As will be understood from the above results, the product $C_2$ which is obtained in an incomplete packing manner without sufficiently suppressing formation of new corundum crystal nuclei contains fine particles of a size below 20μ in an amount larger than the product $C_1$ prepared under satisfactory packing conditions, and is not sharp in distribution of size. Further, the mean diameter of the product $C_1$ is sufficiently greater than the mean diameter, 16.3μ, of the seed crystals, while the degree of increase in the mean diameter of the product $C_2$ is slight.

EXAMPLE 5

The other half of the starting mixture $C_0$ of Example 2 was filled together with water in an uncovered internal case (having an inner diameter of 20 mm and a depth of 480 mm) in the same manner as in Example 4. Then, the internal case was set in an autoclave with an inner volume of 250 ml. The temperature and pressure in the autoclave was increased in such a manner that the temperature of the upper portion of the internal case was lower by about 50° C. than that of the lower portion of the internal case, followed by a hydrothermal treatment at the lower portion and upper portion temperatures of 450° C. and 400° C., respectively, under a pressure of 300 kg/cm² for 5 hours. The resulting product $C_3$ (composed of 100% corundum) was subjected to a determination of the content, by weight, of fine particles of a size below 10μ. The test results are shown in Table 5 together with those of the product $C_1$ of Example 2 and the product $C_2$ of Example 4 for comparative purpose.

Table 5

| product | content of fine particles of size below 10μ on weight basis |
|---|---|
| $C_1$ | 1.0% |
| $C_2$ | 14.5% |
| $C_3$ | 24.4% |

As will be understood from the above results, when formation of new corundum crystal nuclei is expedited by positively providing the temperature gradient in the portion of the starting mixture-packed container, it is difficult to suitably control the size of corundum particles.

EXAMPLE 6

Three kinds of seed crystals and starting alumina trihydrate as indicated in Table 6 were provided in order to prepare corundum particles with different particle sizes in the ranges of 3–6μ, 8–13μ and 20–32μ.

Table 6

| intended particle size | 3-6μ | 8-13μ | 20-32μ |
|---|---|---|---|
| kind seed crystal | fine powder of Bayer alumina | fine powder of fused corundum | |
| mean diameter | 0.85μ | 2.8μ | 10.3μ |
| particle size range | 0.5-1.5μ | 1.5-4μ | 6-13μ |
| ratio to starting material | 3.9 wt % | 2.0 wt % | 5.9 wt % |
| $W_R/A_S$ ratio | 0.0013 g/cm² | 0.004 g/cm² | 0.0095 g/cm² |
| kind starting material | alumina trihydrate obtained by Bayer process | | |
| mean diameter | 8.5μ | | |
| packed amount | 3.5 kg | | |

These three combinations of starting material and seed crystals were each sufficiently mixed in a high-speed agitating mixer (Henschel mixer), followed by a hydrothermal treatment by the following manner.

The total amount of each of the three starting mixtures was filled up together with a small amount of water in a stainless steel internal case with an inner diameter of 60 mm and an inner volume of 3.3 l. The case was covered with a stainless steel lid having a through-hole with a diameter of 3 mm at the center thereof and set in a 4.5 l modified Bridgeman type autoclave for effecting a hydrothermal treatment at 450° C. under a pressure of 300 kg/cm² for 6 hours.

The respective products obtained by the hydrothermal treatment were each confirmed to be corundum particles of a polyhedric form. The distribution of size and mean diameter of the respective products were determined, with the results shown in Table 7 below.

Table 7

| intend parti-cle size | size distribution of obtained corundum particles (wt. %) | | | | | | | | mean di-ame-ter (μ) |
|---|---|---|---|---|---|---|---|---|---|
| | 55-45 (μ) | 45-32 (μ) | 32-20 (μ) | 20-13 (μ) | 13-8 (μ) | 8-6 (μ) | 6-3 (μ) | 3-1 (μ) | |
| 3-6μ | 0 | 0 | 0 | 0 | 0 | 17.5 | 80.0 | 2.5 | 4.8 |
| 8-13μ | 0 | 0 | 0 | 1.5 | 72.5 | 18.0 | 6.5 | 1.5 | 9.5 |
| 20-32μ | 0.8 | 16.5 | 73.2 | 9.5 | 0 | 0 | 0 | 0 | 27.0 |

From the above results, it will be clear that the corundum particles of the intended sizes were obtained each at a yield of above 70%.

Then, the impurity content of the corundum particles of the intended size of 8-13μ was determined in comparison with commercially available fused corundum particles (white and brown products) each with a particle size in the same range. The test results are shown in Table 8 below.

Table 8

| sample | impurity content (ppm) | | | | |
|---|---|---|---|---|---|
| | Na | Fe | Si | Ti | K |
| corundum particles obtained by the method of invention | 110 | 50 | 20 | 20 | <5 |
| crushed particles of known fused corundum (white) | 2000 | 195 | 25 | 20 | 30 |
| " (brown) | 690 | 240 | 9500 (0.95%) | 15000 (1.5%) | 180 |

EXAMPLE 7

To 3.49 kg of boehmite (alumina monohydrate, Al$_2$O$_3$.H$_2$O) with a particle size of 2-3μ when determined by microscopic observation was added fine particles of fused corundum having a size range of 1.5-4μ and a mean diameter of 2.8μ so as to provide a $W_R/A_S$ ratio of 0.005 g/cm² or an amount of 2.9 wt%, of corundum, followed by mixing and hydrothermally treating in the same manner as in Example 6. The resulting product was composed of 100% corundum and had an almost spherical polyhedric form. The distribution of size and mean diameter of the product are shown in Table 9.

Table 9

| distribution of size (wt %) | | | | | mean diameter (μ) |
|---|---|---|---|---|---|
| 20-13μ | 13-8μ | 8-6μ | 6-3μ | 3-1μ | |
| 2.5 | 55.0 | 26.5 | 13.5 | 2.5 | 8.5 |

What is claimed is:

1. A method for preparing corundum particles comprising adding fine seed crystals of corundum particles to solid alumina hydrate and subjecting the resulting mixture to a hydrothermal treatment by heating said mixture under pressure in water under conditions which suppress formation of new corundum crystal nuclei, to deposit corundum onto the surfaces of said fine seed crystals and thereby grow said corundum particles; wherein said conditions include:

(1) the total weight $W_R$, in grams, of said solid alumina hydrate when calculated as trihydrate and the surface area $A_S$, in square centimeters, of said fine seed crystals being such as to provide a ratio, $W_R/A_S$, of less than 0.05 g/cm², to ensure the deposition of said corundum on the surfaces of said fine seed crystals before the concentration of aluminate ions derived from said solid alumina hydrate in said water during said hydrothermal treatment, reaches a value sufficient to produce new corundum crystal nuclei;

(2) said solid alumina hydrate and said fine seed crystals being uniformly mixed prior to said hydrothermal treatment; and (3) suppressing the convection current of said water to a minimum by packing said uniform mixture, in water, in a first container and placing said first container in a second larger container for said hydrothermal treatment;

and wherein the temperature and pressure of said hydrothermal treatment are 370° to 450° C. and 150 to 500 kg/cm², respectively.

2. A method according to claim 1, wherein the ratio $W_R/A_S$ is below 0.02 g/cm².

3. A method according to claim 1, wherein the packing density of said solid alumina hydrate in said first container is 0.65 to 1.6 g/cm³, calculated as trihydrate.

4. A method according to claim 1, wherein the temperature difference between the upper and lower portions of said first container is not more than 10° C.

5. A method according to claim 1, wherein the temperature and pressure of said hydrothermal treatment are 400°-450° C. and about 300 kg/cm², respectively, and wherein said hydrothermal treatment is conducted for a period of time of from two to three hours.

6. A method for preparing substantially spherical polyhedric corundum particles of excellent crystallinity and purity comprising adding fine seed crystals of corundum particles having a particle size of less than 100 microns to solid alumina hydrate dissolved in water and subjecting the resulting mixture, in water, to a hydrothermal treatment by heating said mixture under pressure in a hydrothermal treatment container under conditions which suppress formation of new corundum crystal nuclei, to deposit corundum onto the surface of said fine seed crystals and thereby grow said corundum particles, wherein the average particle size of the product corundum particles is greater than the average particle size of said fine seed crystals; wherein said conditions include:

(1) the total weight $W_R$, in grams, of said solid alumina hydrate, calculated as trihydrate, and the total surface area $A_S$, in square centimeters, of said fine seed crystals, being such as to provide a ratio, $W_R/A_S$, of less than 0.02 g/cm$^2$;

(2) said solid alumina hydrate and said fine seed crystals being uniformly mixed prior to said hydrothermal treatment; and (3) suppressing the convection current of said water to a minimum by packing said uniform mixture in water in a first container, smaller than said hydrothermal treatment container, which is placed in said hydrothermal treatment container during said hydrothermal treatment and wherein the temperature difference between the upper and lower portions of said first container is not more than 10° C.;

and wherein the temperature and pressure of said hydrothermal treatment are 370° to 450° C. and 150 to 500 kg/cm$^2$, respectively.

7. A method according to claim 6, wherein the packing density of said solid alumina hydrate in said first container is 0.65 to 1.6 g/cm$^3$ calculated as trihydrate.

* * * * *

UNITED STATES PATENT AND TRADEMARK OFFICE
CERTIFICATE OF CORRECTION

PATENT NO. : 4,193,768
DATED : March 18, 1980
INVENTOR(S) : NAOAKI OHISHI, et al.

It is certified that error appears in the above-identified patent and that said Letters Patent are hereby corrected as shown below:

Col. 1, line 43, change "specification" to --specifications--;

Col. 1, line 52, add --hardly-- before "contain" and delete "no" before --spherically--;

Col. 5, line 23, change "$W_A/A_s$" to --$W_R/A_S$--;

Col. 13, line 12, change "fine seed crystals" to --corundum particles--.

Signed and Sealed this

Fifteenth Day of July 1980

[SEAL]

Attest:

SIDNEY A. DIAMOND

Attesting Officer

Commissioner of Patents and Trademarks